United States Patent [19]

Fulker et al.

[11] Patent Number: 5,534,067
[45] Date of Patent: Jul. 9, 1996

[54] SPRAYING SYSTEM FOR SPRAYING PRINTED CIRCUIT BOARDS

[75] Inventors: Philip H. Fulker, Aylesford; Trevor A. Smith, Sheppey, both of England

[73] Assignee: Electrovert USA Corp., Camdenton, Mo.

[21] Appl. No.: 202,550

[22] Filed: Feb. 28, 1994

[30] Foreign Application Priority Data

Mar. 5, 1993 [GB] United Kingdom ............... 9304491

[51] Int. Cl.$^6$ .................................................. B05C 11/00
[52] U.S. Cl. ..................... 118/681; 118/680; 118/668; 118/676; 118/323; 118/324
[58] Field of Search ................................. 118/324, 323, 118/313, 302, 315, 668, 676, 679, 674, 696, 712, 680, 681

[56] References Cited

U.S. PATENT DOCUMENTS

| | | | |
|---|---|---|---|
| 3,112,723 | 12/1963 | Potocki | 118/684 |
| 3,741,150 | 6/1973 | Napor et al. | 118/302 |
| 4,419,384 | 12/1983 | Kane et al. | 118/324 |
| 4,421,800 | 12/1983 | Schoenberg et al. | 427/424 |
| 5,240,746 | 8/1993 | O'Connell Litteral | 427/510 |
| 5,256,203 | 10/1993 | Moore et al. | 118/698 |
| 5,368,219 | 11/1994 | Hogar et al. | 228/33 |

FOREIGN PATENT DOCUMENTS 833754 4/1960 United Kingdom.
1209651 10/1970 United Kingdom.

OTHER PUBLICATIONS

European Patent Office Standard Search Report (File: T10–3418).

Primary Examiner—David L. Lacey
Assistant Examiner—Calvin Padgett
Attorney, Agent, or Firm—Harold Gell

[57] ABSTRACT

A spraying system comprises a conveyor for conveying a series of boards through a spraying station, spray nozzles at the spraying station and a mechanism for controlling spraying from the nozzles onto the board located at the spraying station. The control mechanism comprises a sensor for sensing the speed of the conveyor, a photoelectric cell for sensing the presence of a board on the conveyor and a logic unit which is positioned and arranged for calculating the length of the board in response to signals from the sensor and photoelectric cell. The logic unit is arranged to activate a supply of liquid flux to the nozzles when the leading edge of the board reaches the spraying station and the nozzles are reciprocated across the conveyor as the board is advanced. Sensors control the nozzles so that spray is delivered only onto the board and is stopped as the nozzles reach the side edges of the board. The system provides controlled spraying only onto the board and eliminates wastage and reduces atmospheric pollution. The system is primarily intended for the flux spraying of printed circuit boards but is not restricted to this use.

9 Claims, 4 Drawing Sheets

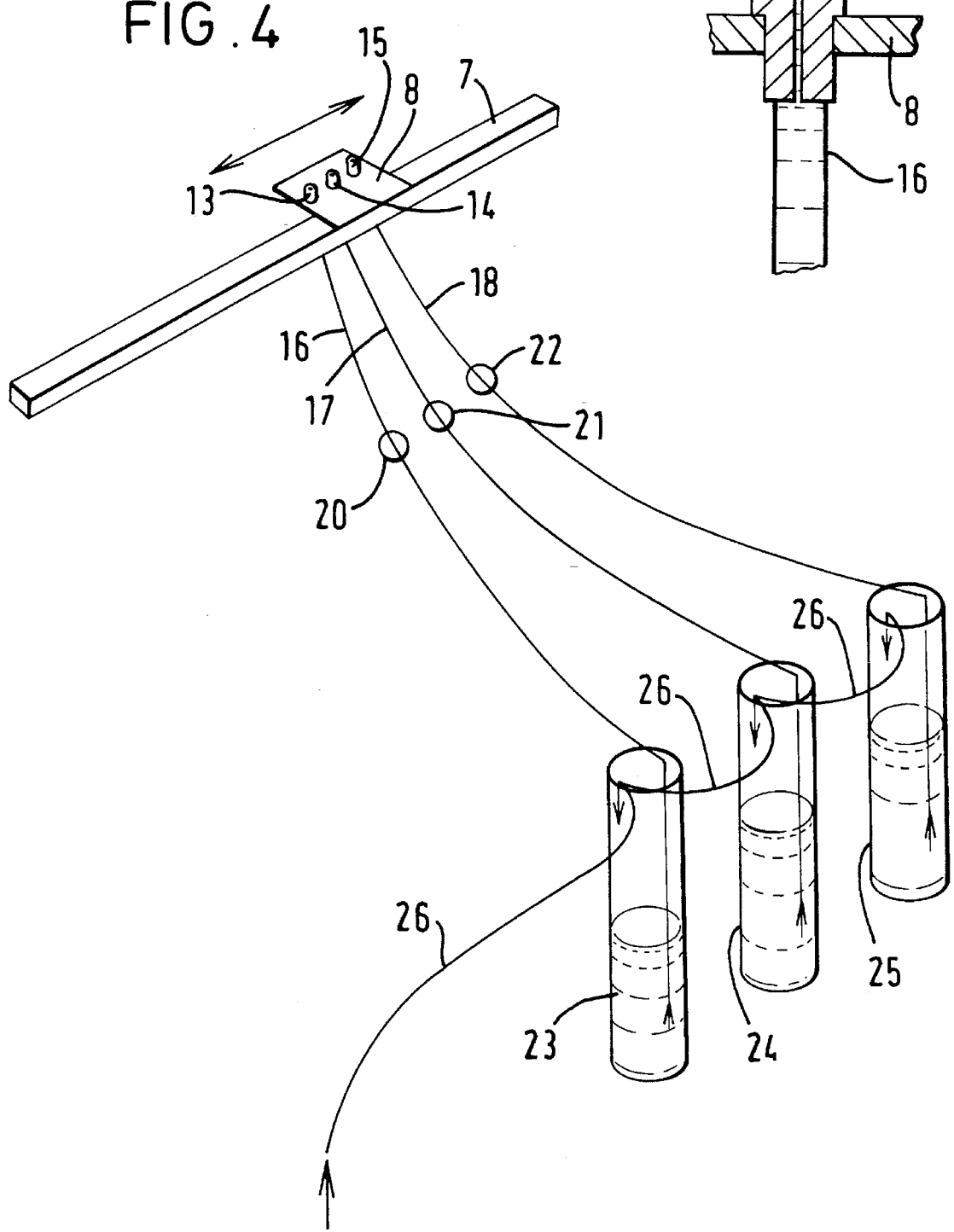

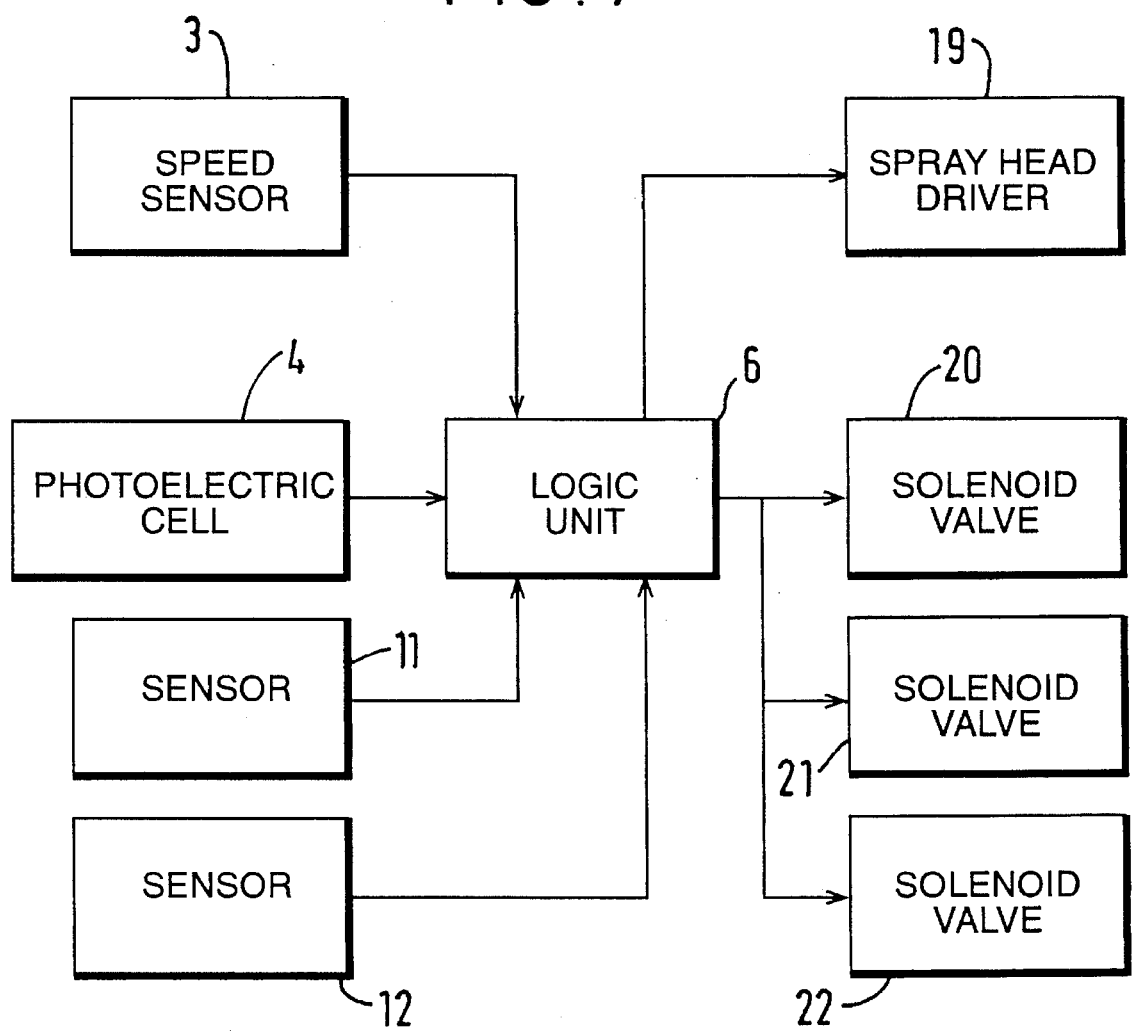

SPRAYING SYSTEM FOR SPRAYING PRINTED CIRCUIT BOARDS

FIELD OF THE INVENTION

This invention relates to sprayers and is particularly concerned with spray fluxing systems.

BACKGROUND OF THE INVENTION

In the production of printed circuit boards which are manufactured by wave soldering techniques, it is known to apply liquid flux to the underside of the circuit boards by foam or wave fluxing techniques. These methods of application have liquid open to the atmosphere which allows the liquid to degenerate, either by evaporation of the solvent component of the flux or by absorption of airborne water and contamination. Moreover, such fluxes are highly flammable and are hazardous to the health of machine operators.

Both moral and legislative environmental considerations have prompted the development of new application techniques. This has led to the introduction of flux formulations having low solids content and no cleaning in order to eliminate the necessity for flux removal by CFC or aqueous based cleaning after the soldering process. Unfortunately, these fluxes degrade easily and it has been difficult to control their composition by automatic means.

Various methods have been proposed to eliminate open liquid vessels which lead to flux degradation and present a health and fire hazard but the very nature of the fluxing medium has led to persistent blockage and an unacceptable degree of maintenance. Moreover, in the known systems, deposition rates have been variable, notably with respect to conveyor speeds and the usually air generated high energy sprays employed have resulted in unwanted deposits on the top side of the circuit boards and overspray has been difficult to contain even if collected adequately by local extraction thereby leading to environmental pollution by exhaust to atmosphere.

SUMMARY OF THE INVENTION

The object of the present invention is to provide a spray fluxing system which overcomes the problems of the existing spray systems.

According to the invention, there is provided a spray fluxing system comprising a conveyor for conveying a series of printed circuit boards through a spraying station, at least one spray nozzle at the spraying station and means for spraying flux through the nozzle onto a printed circuit board located at the spraying station; wherein control means are provided comprising means for sensing the speed of the conveyor, means for sensing the presence of a board on the conveyor and means for determining the length of the board in response to said board sensing means; means for determining when the leading edge of the board reaches the spraying station, means for activating the flux spraying means when the leading edge of said board reaches the spraying station, means for reciprocating the nozzle beneath the circuit board while said board is located at the spraying station, and control means for ensuring that flux is sprayed from the nozzle only when at least a portion of the board is located over said nozzle, said nozzle being caused to move to perform a spraying pass in response to a signal from the determining means indicating that the board has moved a predetermined distance on the conveyor with respect to the spraying station.

According to the spray fluxing system of the invention, deposition rate of the flux on the circuit board is independent of the conveyor speed because spray from the nozzle is stopped at the end of each traverse until the conveyor has moved the circuit board forward by a predetermined distance. The deposition rate according to the invention is controlled by the speed of traverse of the nozzle, selection of the nozzle tip and fluid pressure.

According to a preferred embodiment of the invention, the system comprises a sensor for sensing the speed of the conveyor, a photoelectric cell for sensing the presence of a board on the conveyor and the length of the board, a logic unit which counts pulses from the speed sensor when the front of the board is sensed by the photoelectric cell and which stops the counting when the back of the board passes the photoelectric cell. The logic unit calculates the length of the board in pulses and the position of the board on the conveyor from the speed sensing means. The logic unit therefore knows when the board reaches a point in line with the spray nozzle and activates a mechanism to cause the spray nozzle to make its first pass under the printed circuit board. Sensors activate spray means so that spray is only delivered from the nozzle onto the board. The spray nozzle is stopped at the end of each pass or traverse and the logic unit sends the spray nozzle back after the board has travelled a preset indexed distance on the conveyor.

Different boards and fluxes require different processing speeds for pre-heat and soldering applications so that the speed of the conveyor needs to be adjustable but the deposition rate should be constant. The system according to the present invention achieves this object.

The width of the conveyor is preferably adjustable to accommodate printed circuit boards of different widths. The spray nozzle is desirably incorporated into a spray head on which is mounted a reflector or flag to activate spray controlling sensors as the spray head traverses below the conveyor. A plurality of spray nozzles may be mounted on the spray head.

Preferably, the system also includes means for spraying flux from the nozzle(s) periodically to clear the nozzle or nozzles in order to prevent blockage.

BRIEF DESCRIPTION OF THE DRAWINGS

The invention will now be further described, by way of example, with reference to the drawings, in which:

FIG. 3 is a longitudinal section, to an enlarged scale, through one of the spray nozzles shown in FIGS. 1 and 2;

FIG. 4 is a diagrammatic perspective view of an embodiment for delivering flux from the spray nozzles of the system according to the invention;

FIG. 7 is a block diagram illustrating the control system according to the invention.

DESCRIPTION OF PREFERRED EMBODIMENT

Figure 1:
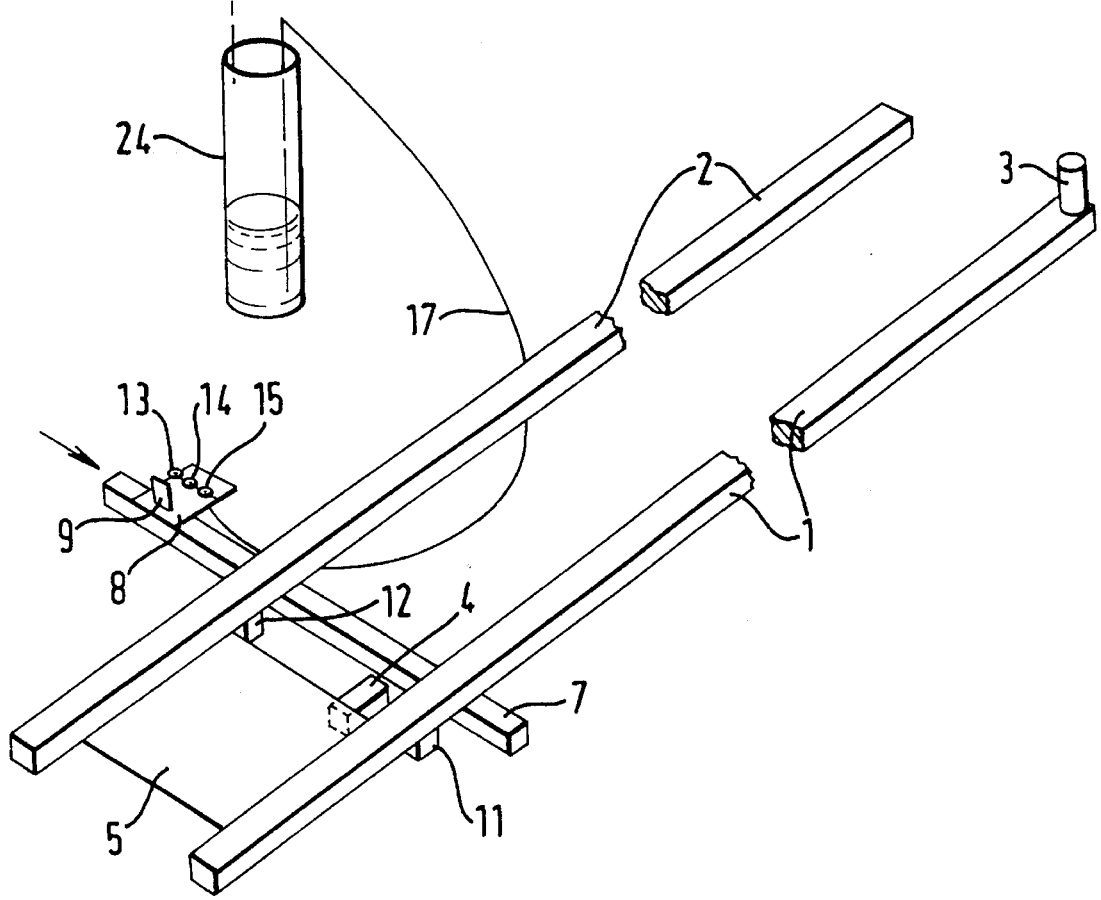
FIG. 1 is a diagrammatic perspective view of part of one embodiment of a spray fluxing system according to the invention.
Figure 2:
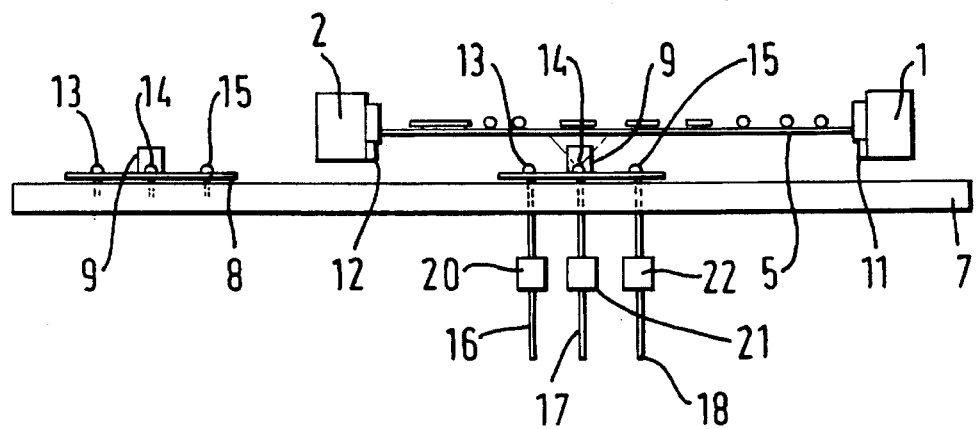
FIG. 2 is a diagrammatic transverse view of the spraying system shown in FIG. 1.

Referring to the drawings, the spray fluxing system according to the invention comprises an adjustable width conveyor having a fixed conveying run 1 and a laterally adjustable conveying run 2. The adjustment means are conventional and have been omitted from the drawings. A sensor unit 3 for sensing the speed of the conveyor is mounted on the fixed run 1 at one end of the conveyor and a photoelectric cell 4 for sensing the presence of a printed circuit board 5 on the conveyor is located below the conveyor adjacent to the fixed run 1. The laterally adjustable conveyor run 2 is displaced to the required width of a circuit board 5 which is to be sprayed with flux so that each lateral edge of the board is supported by a respective run of the conveyor.

The speed sensor 3 and the photoelectric cell 4 are connected to a logic unit 6 which has counting means for counting pulses from the speed sensor which are activated when the logic unit receives a signal from the photoelectric cell indicating the presence of a printed circuit board on the conveyor. The counting means are stopped when the logic unit receives a further signal from the photoelectric cell when the trailing edge of the printed circuit board has been moved by the conveyor beyond the photoelectric cell which is fixed in position. The logic unit further includes determining means which calculates the length of the board from the number of pulses counted by the counting means and from the speed of the conveyor as sensed by the sensor unit 3. The determining means is also arranged to calculate the position of the leading edge of the printed circuit board on the conveyor which can be determined from the point at which the first signal from the photoelectric cell is received by the logic unit, which signal is triggered when the leading edge of the board is sensed by the photoelectric cell, and from the speed of the conveyor which is sensed by the speed sensor.

Mounted transversely to the conveyor and intermediate its ends is a rail 7 along which a multiple nozzle spray head 8 is arranged to reciprocate in the directions indicated by the double arrow in FIG. 4. Adjacent to the rail 7, a first sensor 11 is mounted on a fixed part of the conveyor run 1 and a second sensor 12 is mounted on the laterally displaceable conveyor run 2 on a part which is fixed relative to the part of the conveyor run engaging and moving a printed circuit board 5. The sensors 11 and 12 are electrically connected to the logic unit 6. A flag 9 is mounted on the spray head 8 and is arranged to be sensed by the sensors 11 and 12 as the spray head is reciprocated along the rail 7.

The multiple spray head 8 has three spray nozzles 13, 14, 15 which are connected by respective pressure fluid lines 16, 17, 18 via respective electric solenoid valves 20, 21, 22 to respective pressure vessels 23, 24, 25 each of which is adapted to contain a suitable flux.

The pressure vessels can be pressurised by a source of compressed air such as a compressor ( not shown ) via pressure hoses 26, preferably to a pressure of about 2 Bar (30–40 psi).

The spray zone emitted by each nozzle is illustrated, by way of example, for the nozzle 13 in FIG. 3. The spray zones emitted from the other nozzles 14 and 15 will normally be substantially the same although these nozzles may be modified to give slightly different spray zones if desired.

As stated above, the determining means in the logic unit is arranged to calculate the position of the leading edge of the printed circuit board as the latter is moved along the conveyor. When the determining means has calculated that the leading edge of the printed circuit board has been advanced to the rail 7, the logic unit sends a signal to drive means 19 to cause the spray head 8 to move along the rail 7 in the direction of the arrow in FIG. 1. Initially, the spray head is not located beneath the printed circuit board and the solenoid valves 20, 21, 22 are closed so that no spray emanates from the spray nozzles. When the sensor 12 on the adjustable conveyor run 2 senses the flag 9 on the spray head 8, a signal is sent to the logic unit 6 which in turn sends a signal to one of the solenoid valves, in the illustrated example the solenoid valve 21, to open the valve to permit flux to be sprayed from the vessel 24 through the nozzle 14 onto the underneath surface of the leading edge of the printed circuit board 5.

Spraying is continued until the flag 9 is sensed by the sensor 11 on the fixed conveyor run 1, the sensor sending a signal to the logic unit 6 which closes the solenoid valve to stop the spraying.

The speed of the spray head 8 along the rail 7 relative to speed of advance of the printed circuit board along the conveyor is arranged to be such that negligible forward movement of the circuit board takes place while the spray head makes a single pass or traverse beneath the board. The pattern of flux sprayed from the nozzle 14 is illustrated in FIG. 6 and the direction of movement of the spray head is indicated by the uppermost arrow in the same figure.

Figure 6:
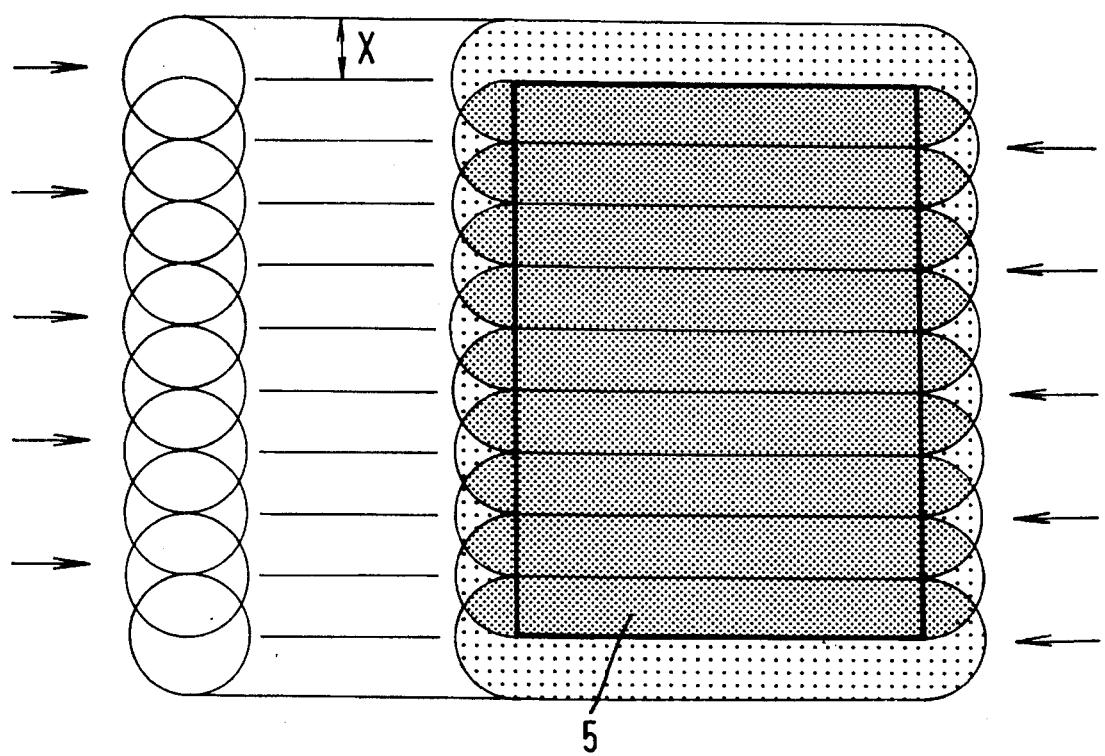
FIG. 6 is a schematic plan view showing the spraying patterns on a printed circuit board which are achievable with the spray fluxing system according to the invention.

The spray head remains at the other end of the rail adjacent to the fixed conveyor run 1 until the printed circuit board has moved forward on the conveyor by a distance "X" as illustrated in FIG. 6, whereupon the drive means is activated to move the spray head 8 along the rail 7 in the opposite direction. As the flag 9 is sensed by the sensor 11, the solenoid valve 21 is opened so that flux is again sprayed from the nozzle 14 as the spray head traverses the rail 7 until the flag 9 is sensed by the sensor 12 when the valve 21 is again closed to stop the spraying while the spray head returns to its initial position on the rail 7. This process is repeated each time the printed circuit board is advanced along the conveyor by the distance "X" until the determining means has calculated that the trailing edge of the printed circuit board has passed beyond the rail 7 when the drive means for the spray head is deactivated until the leading edge of another printed circuit board is located over the rail 7.

Figure 5:
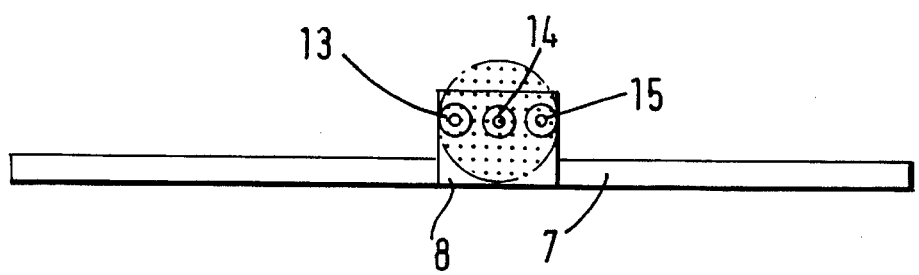
FIG. 5 is a plan view of the multiple spray nozzle head illustrating the spray pattern delivered from an exemplary one of the nozzles.

FIG. 5 illustrates the pattern of flux sprayed from the central nozzle 14 on the spray head 8. The pattern sprayed from the other nozzles 13 and 15 will be similar but laterally displaced to the left and right respectively of the spray head.

The spray head is provided with a plurality of nozzles, in this case three, in order that different fluxes can be sprayed onto printed circuit boards without having to change pressure vessels and spray nozzles. It is merely necessary to set the logic unit to open and close the appropriate solenoid valve in order to spray the desired flux onto printed circuit boards. Different fluxes are required for different soldering operations and techniques. However, it is not essential to provide the spray head with more than one nozzle and a single nozzle with associated solenoid valve could be provided although in this case the connection to the pressure vessel would have to be changed and the pressure line and nozzle purged before the new flux could be sprayed.

In order to avoid blockage of the spray nozzles, the logic unit is preferably arranged to open each of the solenoid valves periodically, at predetermined intervals, for a brief burst of flux from the nozzles in order to keep them open. The nozzles are in any case desirably readily detachable from the spray head in order that they can easily be replaced in the case of blockage.

The use of closed pressure vessels for containing the flux at comparatively low pressures enables a low energy spray to be utilised in order to minimise overspray and containment problems. Further, the closed pressure vessels for the flux avoid atmospheric pollution and evaporation. While it is preferred to pressurise the vessels with compressed air in the interests of cheapness, this is not essential and the vessels may be compressed with any suitable, preferably inert, gas such as nitrogen for example.

Controlling the spray pattern by measuring the rate of advance of the circuit board along the conveyor means that the deposition rate is independent of the conveyor speed. As will be clear from the foregoing, the deposition rate is dependent upon the speed of traverse of the spray head beneath the conveyor, the size of the spray nozzle and the pressure in the associated pressure vessel. This is important because different circuit boards and fluxes require different processing speeds for subsequent operations such as pre-heat and soldering applications so that the speed of the conveyor needs to be adjustable. The deposition rate, however, needs to be constant so that the deposition rate should be independent of the conveyor speed and this is achieved by means of the system according to the invention.

The spray fluxing system according to the invention therefore overcomes substantially all of the problems encountered by the previously known systems.

The invention is not restricted to the above-described embodiment but modifications and variations may be made without departing from the scope of the invention. Moreover, the spraying system according to the invention is not restricted to sprayers for flux but can also be used for other materials such as paints.

We claim:

1. A spraying system comprising a spraying station;

a conveyor positioned and arranged for conveying a series of printed circuit boards through said spraying station, each board having a leading edge and a trailing edge;

a spray nozzle at the spraying station for spraying liquid flux onto a board located at the spraying station;

means for supplying liquid flux to said spray nozzle, sensing means positioned and arranged to sense the speed of the conveyor and to emit a series of pulses proportional to the sensed speed of said conveyor, sensing means for sensing the presence of a board on the conveyor;

a logic unit positioned and arranged to count the pulses from the said speed sensing means and being arranged to commence counting pulses when the leading edge of a board is sensed by said board sensing means and to stop the counting of pulses when the trailing edge of the board passes beyond said board sensing means;

said logic unit being further arranged to calculate the length of the board in pulses and the rate of movement and hence the position of the board on the conveyor from said speed sensing means thereby to determine when the leading edge of the board reaches the spraying station and the progress of said board along the conveyor;

means for activating the supply means when the leading edge of the board reaches the spraying station;

means for reciprocating said spray nozzle beneath the board while the board is located at the spraying station;

means for controlling said spray nozzle whereby liquid flux is sprayed from the spray nozzle during reciprocation of the nozzle only when said nozzle is located below the board;

and means for controlling reciprocating movement of said spray nozzle in such a manner that movement of the nozzle in one direction is stopped at one side of the conveyor and movement of the nozzle in the opposite direction is not commenced until said control means receives a signal from the logic unit indicating that the board has moved a predetermined distance on the conveyor with respect to the spraying station.

2. A spraying system as claimed in claim 1, wherein the spray nozzle is incorporated into a spray head on which is mounted a reflector or flag to activate the supply control means as the spray head traverses the conveyor.

3. A spraying system as claimed in claim 2, further includes a plurality of spray nozzles are mounted on the spray head.

4. A spraying system as claimed in claim 2, wherein means are provided for spraying liquid periodically through the nozzle to prevent blockage thereof.

5. A spraying system as claimed in claim 1 and further including means for adjusting and regulating the speed of the conveyor.

6. A spraying system as claimed in claim 1, wherein the conveyor has a width which is adjustable.

7. A spraying system as claimed in claim 1, wherein the system further includes a closed pressure vessel positioned and arranged to contain liquid to be sprayed and connected by a pressure line to the nozzle.

8. A spraying system as claimed in claim 7, wherein a valve is provided in said pressure line, said valve being positioned and arranged to open in response to a signal from the control means.

9. A spraying system as claimed in claim 7, wherein the pressure vessel is pressurised with compressed air.

* * * * *